United States Patent [19]
Akimoto et al.

[11] Patent Number: 5,268,918
[45] Date of Patent: Dec. 7, 1993

[54] SEMICONDUCTOR LASER

[75] Inventors: Katsuhiro Akimoto; Hiroyuki Okuyama, both of Kanagawa, Japan

[73] Assignee: Sony Corporation, Tokyo, Japan

[21] Appl. No.: 838,925

[22] Filed: Feb. 21, 1992

[30] Foreign Application Priority Data

Feb. 21, 1991 [JP] Japan .................................. 3-027484
Mar. 18, 1991 [JP] Japan .................................. 3-052553

[51] Int. Cl.[5] .............................................. H01S 3/19
[52] U.S. Cl. .................................. 372/45; 257/13
[58] Field of Search ............ 372/45; 357/17; 257/13, 257/79

[56] References Cited

U.S. PATENT DOCUMENTS

| | | | |
|---|---|---|---|
| 5,008,891 | 4/1991 | Morita | 372/45 |
| 5,010,376 | 4/1991 | Nishimura et al. | 372/45 |
| 5,045,897 | 9/1991 | Ahlyren | 372/45 |

FOREIGN PATENT DOCUMENTS

| | | | |
|---|---|---|---|
| 0288088 | 11/1988 | Japan | 372/45 |
| 0169985 | 7/1989 | Japan | 372/45 |
| 0020086 | 1/1990 | Japan | 372/45 |
| 0196485 | 8/1990 | Japan | 372/45 |

OTHER PUBLICATIONS

Okuyama et al, "Epitaxial Growth of ZnMgSSe on GaAs Substrate by Molecular Beam Epitaxy", *Japanese Journal of Applied Physics*, vol. 30, No. 9B, Sep. 1991, pp. L 1620-L 1623.
Okuyama et al, "ZnSe/ZnMgSSe Blue Laser Diode", *Electronics Letters*, vol. 28, No. 19, Sep. 10, 1992, pp. 1798-1799.

*Primary Examiner*—Georgia Y. Epps
*Attorney, Agent, or Firm*—Hill, Steadman & Simpson

[57] ABSTRACT

A double heterojunction II-VI group compound semiconductor laser has a substrate of GaAs or Gap, a first cladding layer, an active layer, and a second cladding layer which are successively deposited on the substrate by way of epitaxial growth. One or both of the first and second cladding layers have a composition of ZnMgSSe.

8 Claims, 3 Drawing Sheets

SEMICONDUCTOR LASER

BACKGROUND OF THE INVENTION

1. Field of the Invention

The present invention relates to a semiconductor laser, and more particularly to a semiconductor laser comprising a II-VI group compound semiconductor lattice-matched to a substrate of GaAs or GaP, for emitting a blue or ultraviolet radiation.

2. Description of the Prior Art

There has been a growing demand in the art for short-wavelength semiconductor lasers for blue or ultraviolet emission to meet the requirements for recording and reproducing high-density and high-resolution information on optical and magneto-optic disks.

Blue or ultraviolet semiconductor lasers are required to be made of direct-transition-type materials having large bandgaps Eg. In particular, double hetero-junction semiconductor lasers are required to have a cladding layer having a greater bandgap than an active layer thereof.

Semiconductor lasers have a substrate on which semiconductor layers are deposited by way of epitaxial growth. Such a substrate should preferably be a single-crystal substrate of GaAs or GaP that is widely used in various general compound semiconductor devices, has good crystalline properties, can be manufactured with ease, is readily available, and inexpensive.

II-VI group compound semiconductors, particularly IIb-VI group compound semiconductors or mixed semiconductors, are promising as optical device materials because they have a direct-transition-type band structure.

The direct-transition-type IIa-VI group compounds with a large bandgap Eg are also attracting attention for use as fluorescent materials. However, the IIa-VI group compounds are chemically unstable since they are hydrolyzable in air, and their basic properties are still unknown.

Therefore, it is considered better to construct optical devices of IIb-VI group compounds. One problem with using IIb-VI group compounds is that it is difficult to select materials having different bandgaps for active and cladding layers, respectively, even if mixed crystals of IIb-VI group compounds are used.

More specifically, FIG. 1 of the accompanying drawings shows the relationship between lattice constants a and bandgaps Eg of various compound semiconductors. As can be seen from FIG. 1, mixed crystals of IIb-VI group compounds have large bowing parameters, which make it difficult to combine materials that are lattice-matched to each other and have a large bandgap difference.

Semiconductor lasers that are currently proposed for emission in a blue range include a semiconductor laser having an active layer of ZnSe and a cladding layer of a superlattice of ZnSSe and ZnSe, and a semiconductor laser having an active layer of ZnCdS and a cladding layer of ZnSSe. However, the bandgap difference between the active and cladding layers of each of these semiconductor lasers is 100 MeV or less, which poses a problem on the function of the cladding layer, i.e., the function of optical and carrier confinement.

Japanese Laid-Open Patent Publication No. 1-16998 discloses a blue semiconductor laser comprising a substrate of GaAs, an active layer of $ZnSe_xS_{1-x}$, and a cladding layer of $Zn_xMg_{1-x}Te$. Japanese Laid-Open Patent Publication No. 63-233576 also shows a p-n junction light-emitting device. However, the presence of $Zn_xMg_{1-x}Te$ that lattice-matches GaAs or GaP has not been experimentally confirmed.

Under the above circumstances, semiconductor lasers of a double heterostructure which have a bandgap Eg $\leq 2.7$ eV have not been in practical use yet, and semiconductor lasers having a substrate of GaAs or GaP which are excitable for continuous oscillation at room temperature have not been provided either.

OBJECTS AND SUMMARY OF THE INVENTION

It is an object of the present invention to provide a double heterojunction semiconductor laser for short-wavelength emission which has a substrate of GaAs or GaP and exhibits good characteristics including emission efficiency.

A double heterojunction short-wavelength semiconductor laser according to the present invention includes an active layer of ZnSSe or ZnCdS, for example, which has a lattice matching GaAs or GaP and emits a radiation of a shorter wavelength than the wavelength for blue, i.e., has a bandgap Eg of 2.7 eV or higher, and a cladding layer of $Zn_xMg_{1-x}S_ySe_{1-y}$ which is a mixed crystal of the IIa-VI and IIb-VI groups and has a bandgap Eg that provides a bandgap difference large enough to perform an optical and carrier confinement function.

A double heterojunction semiconductor laser according to the present invention includes p-type and n-type cladding layers made of respective different II-VI compound semiconductors. Specifically, the n-type cladding layer is made of a II-VI compound semiconductor that tends to be of the n-type, and the p-type cladding layer is made of a II-VI compound semiconductor that tends to be of the p-type. In particular, the p-type compound semiconductor includes a II group element which partly comprises a compound semiconductor containing Be having a small tetrahedral covalent bonding radius.

According to the present invention, a double heterojunction semiconductor comprises a first cladding layer of a first conductivity type, an active layer, and a second cladding layer of a second conductivity type which are successively deposited on a substrate by way of epitaxial growth.

According to an aspect of the present invention, there is provided a semiconductor laser comprising a substrate of GaAs of a first conductivtty type such as a p-or n-type, a first cladding layer having a composition of $Zn_xMg_{1-x}S_ySe_{1-y}$ (x, y are atomic ratios) of the first conductivity type deposited on the substrate by way of epitaxial growth, an active layer deposited on the first cladding layer by way of epitaxial growth, and a second cladding layer having a composition of $Zn_xMg_{1-x}S_ySe_{1-y}$ of a second conductivity type such as an n- or p-type deposited on the active layer by way of epitaxial growth. In the composition of the first and second cladding layers, the atomic ratios x, y are selected in the ranges of:

$0.3 \leq x \leq 0.9$, and $0.06 \leq y \leq 0.9$.

According to another aspect of the present invention, there is provided a semiconductor laser comprising a substrate of GaAs, a first cladding layer deposited on the substrate by way of epitaxial growth, an active layer deposited on the first cladding layer by way of epitaxial growth, and a second cladding layer deposited on the active layer by way of epitaxial growth, the first or second cladding layer comprising an n-type cladding layer made of a ZnMgSSe compound semiconductor and the other comprising a p-type cladding layer made of a BeZnSTe compound semiconductor. Particularly, the p-type cladding layer has a composition of $Be_aZn_{1-a}S_bTe_{1-b}$ with atomic ratios a, b being selected in the ranges of:

$$0.1 \leq a \leq 0.7,$$

and $$0.5 \leq b \leq 0.9.$$

According to still another aspect of the present invention, there is provided a semiconductor laser comprising a substrate of GaP of a first conductivity type such as a p- or n-type, a first cladding layer having a composition of $Zn_xMg_{1-x}S_ySe_{1-y}$ (x, y are atomic ratios) of the first conductivity type deposited on the substrate by way of epitaxial growth, an active layer deposited on the first cladding layer by way of epitaxial growth, and a second cladding layer having a composition of $Zn_xMg_{1-x}S_ySe_{1-y}$ of a second conductivity type such as an n- or p-type deposited on the active layer by way of epitaxial growth. In the composition of the first and second cladding layers, the atomic ratios x, y are selected in the ranges of:

$$0.5 \leq x \leq 0.9,$$

and $$0.4 \leq y \leq 0.9.$$

According to yet still another aspect of the present invention, there is provided a semiconductor laser comprising a substrate of GaP, a first cladding layer deposited on the substrate by way of epitaxial growth, an active layer deposited on the first cladding layer by way of epitaxial growth, and a second cladding layer deposited on the active layer by way of epitaxial growth, the first or second cladding layer comprising an n-type cladding layer made of a ZnMgSSe compound semiconductor and the other comprising a p-type cladding layer made of a BeZnSSe compound semiconductor. Particularly, the p-type cladding layer has a composition of $Be_aZn_{1-a}S_bTe_{1-b}$ with atomic ratios a, b being selected in the ranges of:

$$0.1 \leq a \leq 0.8,$$

and $$0.2 \leq b \leq 0.9.$$

With the present invention, the cladding layers are made of ZnMgSSe which is a mixed crystal of IIb-VI and IIa-VI groups. Since Mg has a large covalent bonding radius even though the atomic number of Mg is smaller than the atomic number of either Zn or Cd, the composition ZnMgSSe can be used as a material which lattice-matches and has a large bandgap Eg.

According to a further aspect of the present invention, the p-type cladding layer includes a II group element which partly comprises a compound semiconductor containing Be having a small tetrahedral covalent bonding radius. Since Be is apt to be poor in stoickiometry and the defect of Be is easily caused, the cladding layer tends to be of the p-type. Therefore, the cladding layer can stably become a p-type cladding layer.

FIG. 2 of the accompanying drawings shows different peak energies of $Zn_xMg_{1-x}S_ySe_{1-y}$ upon photoluminescence, which were measured at a band end and plotted when the atomic ratios x, y varied. The compositions lattice-match GaAs on a straight line A in FIG. 2.

The measured band-end peak energies indicate that the peaks are shifted into a higher energy range as the proportion of Mg increases.

As the proportion of Mg increases, the morphology of the material surface becomes poor. Even if the morphology becomes poor, the semiconductor material lattice-matches GaP or GaAs with a higher lattice constant, and provides an increased bandgap of 4 eV.

It has been confirmed that ZnMgSSe in the above composition range is not hydrolyzed when left at room temperature for three to four months, and hence is highly stable.

With the double heterojunction semiconductor laser of the above structure, even if the bandgap energy Eg of the active layer is 2.7 eV or higher, the cladding layers have a bandgap energy Eg that exceeds the bandgap energy of the active layer by at least 100 meV and is well lattice-matched to the substrate of GaAs or GaP. Therefore, the cladding layers have good crystalline properties and are capable of sufficiently performing their function, i.e., the function of optical and carrier confinement. The semiconductor laser emits a radiation highly efficiently in a short wavelength range, and has a low threshold current.

The above and other objects, features, and advantages of the present invention will become apparent from the following description of illustrative embodiments thereof to be read in conjunction with the accompanying drawings, in which like reference numerals represent the same or similar objects.

DETAILED DESCRIPTION OF THE PREFERRED EMBODIMENT

Figure 1:
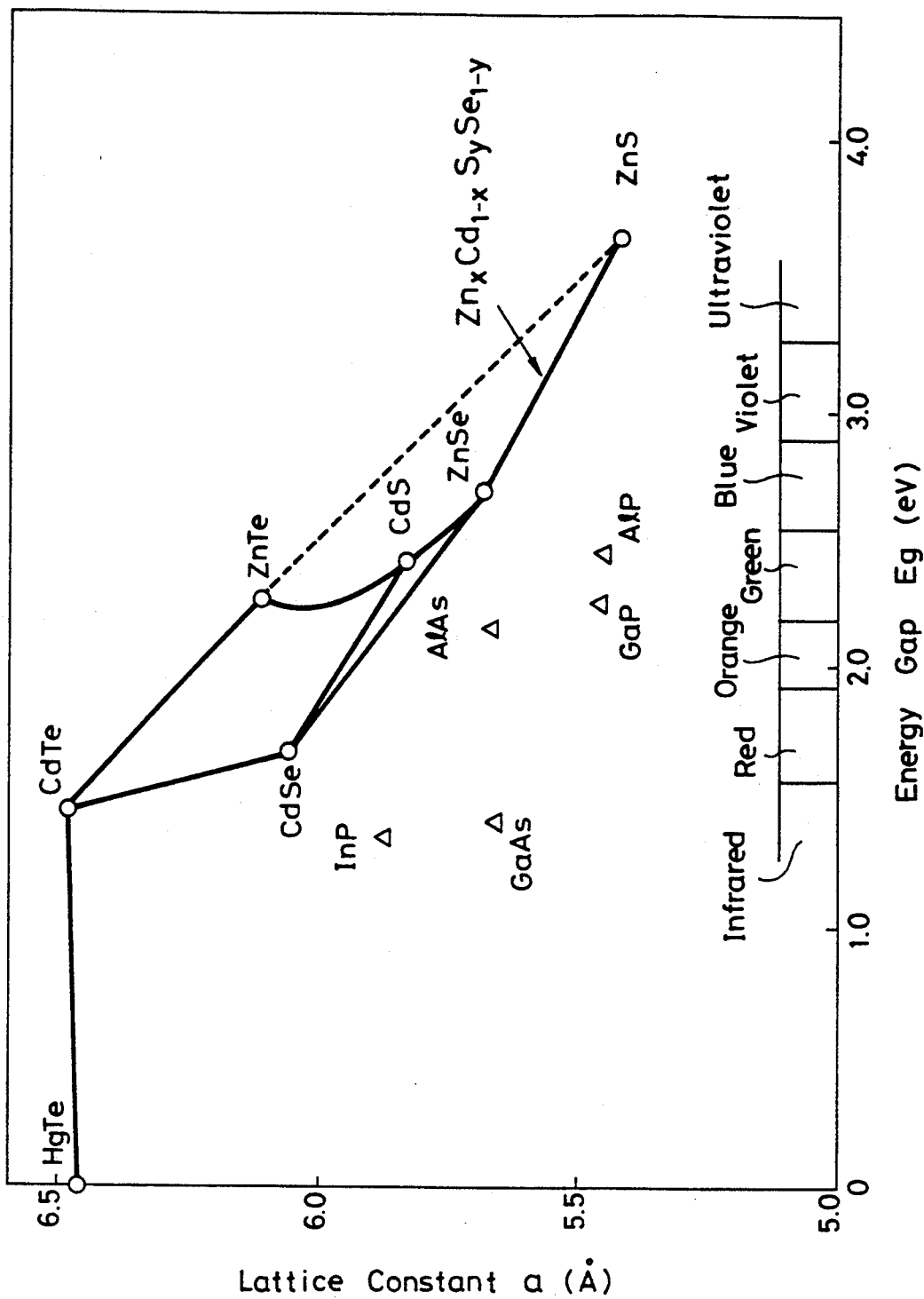
FIG. 1 is a diagram showing the relationship between lattice constants and energy gaps of typical compound semiconductors.
Figure 2:
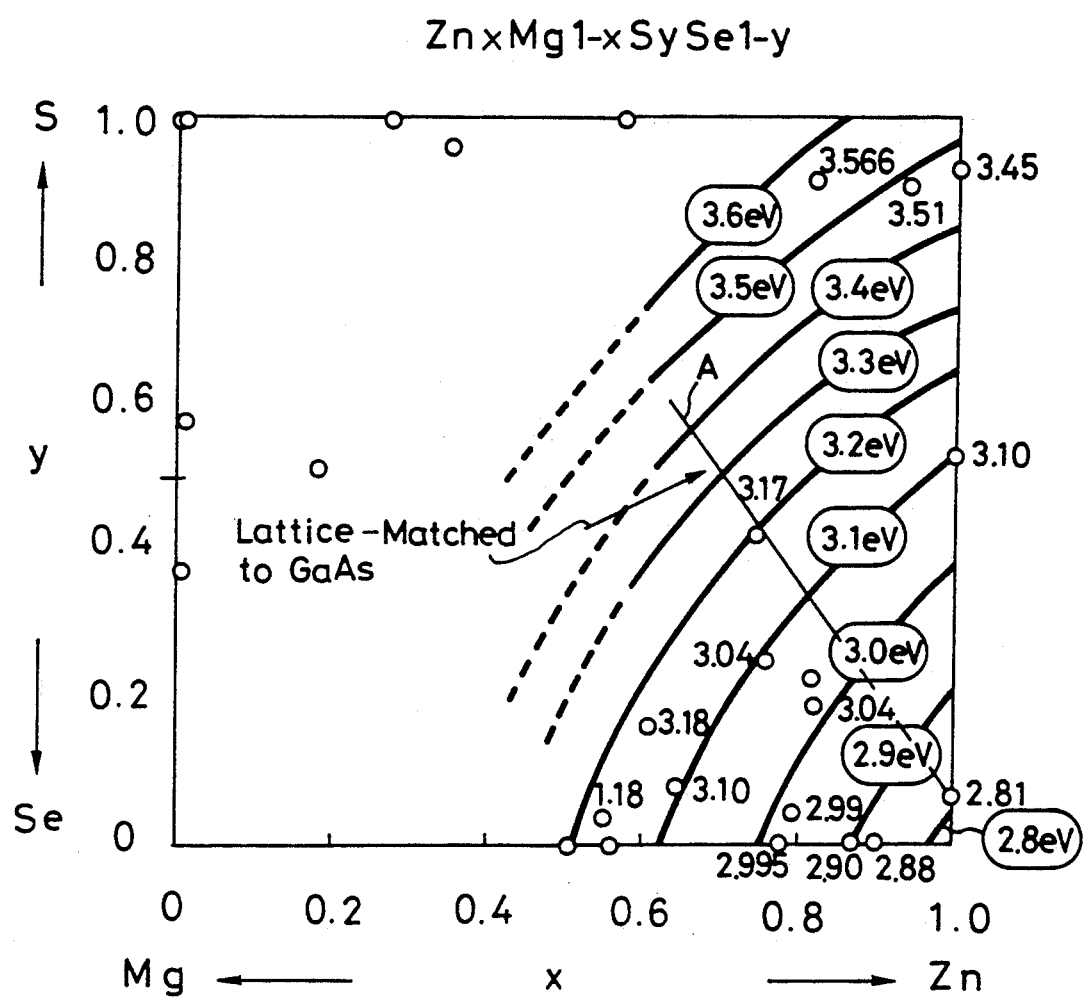
FIG. 2 is a diagram of different peak energies of the band-edge of ZnMgSSe upon photoluminescence, dependent on the proportions of the composition of the ZnMgSSe.
Figure 3:
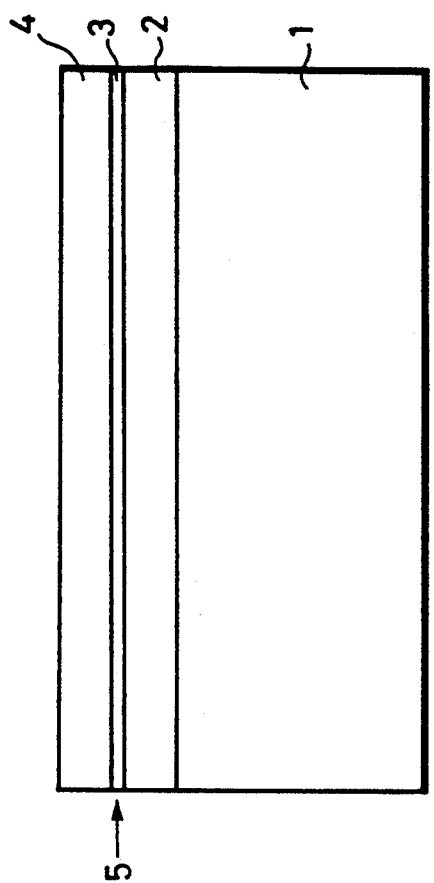
FIG. 3 is a schematic cross-sectional view of a semiconductor laser according to the present invention.

As shown in FIG. 3, a semiconductor laser according to the present invention comprises a substrate 1 in the form of a single-crystal substrate of GaAs or GaP, with a buffer layer deposited thereon, if necessary, by way of epitaxial growth. The semiconductor laser also includes a first p- or n-type cladding layer 2 deposited on the substrate 1, a p-, n-, or intrinsic i-type active layer 3 deposited on the cladding layer 2 and having a sufficiently low impurity concentration, and a second n-or p-type cladding layer 4 deposited on the active layer 3. These layers 2, 3, 4 are successively deposited by the MBE (molecular beam epitaxy) process or the MOCVD (metal organic chemical vapor deposition) process.

A wafer thus produced by depositing the semiconductor layers by way of epitaxial growth is then cleaved, providing a laser having a cleaved surface as an emission end surface 5.

EXAMPLE 1

The substrate 1 was made of a single crystal of GaAs. The first and second cladding layers 2, 4 were made of $Zn_xMg_{1-x}S_ySe_{1-y}$ with x being about 0.8 and y about 0.3, and each had a thickness of 1 μm. The active layer 3 was made of $ZnS_zSe_{1-z}$ with z being about 0.06 and had a thickness of 0.1 μm.

An electrode was attached to the reverse side of the substrate 1 and another striped electrode was attached to the second cladding layer 4, and a voltage was applied in a forward direction between the electrodes. Alternatively, an electron beam was applied to the semiconductor laser from the side of the second cladding layer 4 to excite the semiconductor laser. As a result, the semiconductor laser emitted a radiation having a wavelength of about 450 nm.

The materials of the cladding layers 2, 4 in Example 1 were measured for a band-edge emission or excited light BE at 4° K. upon photoluminescence PL. The measured band-edge emission BE was of about 3.1 eV. The band-edge emission BE from the active layer 3 was of about 2.8 eV. The cladding layers 2, 4 and the active layer 3 were well lattice-matched to the GaAs substrate 1 in epitaxial growth.

The difference between the band-edge emissions BE between the cladding layers 2, 4 and the active layer 3 indicates that the bandgap difference therebetween was of a high value of about 300 meV (the band-edge emission BE is slightly smaller than the energy gap).

EXAMPLE 2

The substrate 1 was made of a single crystal of GaAs. The first and second cladding layers 2, 4 were made of $Zn_xMg_{1-x}S_ySe_{1-y}$ with x being about 0.8 and y about 0.3, and each had a thickness of 1 μm. The active layer 3 was made of $Zn_zCd_{1-z}S$ with z being about 0.42 and had a thickness of 0.1 μm.

An electrode was attached to the reverse side of the substrate 1 and another striped electrode was attached to the second cladding layer 4, and a voltage was applied in a forward direction between the electrodes. Alternatively, an electron beam was applied to the semiconductor laser from the side of the second cladding layer 4 to excite the semiconductor laser. As a result, the semiconductor laser emitted a radiation having a wavelength of about 450 nm.

The materials of the cladding layers 2, 4 in Example 2 were measured for a band-edge emission or excited light BE upon photoluminescence PL. The measured band-edge emission BE was of about 3.1 eV. The band-edge emission BE from the active layer 3 was of about 2.85 eV. The cladding layers 2, 4 and the active layer 3 were well lattice-matched to the GaAs substrate 1 in epitaxial growth.

The bandgap difference between the cladding layers 2, 4 and the active layer 3 was of a high value of about 300 meV.

EXAMPLE 3

The substrate 1 was made of a single crystal of GaP. The first and second cladding layers 2, 4 were made of $Zn_xMg_{1-x}S_ySe_{1-y}$ with x being about 0.9 and y about 0.9, and each had a thickness of 1 μm. The active layer 3 was made of $ZnS_zSe_{1-z}$ with z being about 0.84 and had a thickness of 0.1 μm.

An electrode was attached to the reverse side of the substrate 1 and another striped electrode was attached to the second cladding layer 4, and a voltage was applied in a forward direction between the electrodes. Alternatively, an electron beam was applied to the semiconductor laser from the side of the second cladding layer 4 to excite the semiconductor laser. As a result, the semiconductor laser emitted an ultraviolet radiation having a wavelength of about 370 nm.

The materials of the cladding layers 2, 4 in Example 3 were measured for a band-edge emission or excited light BE upon photoluminescence PL. The measured band-edge emission BE was of about 3.6 eV. The band-edge emission BE from the active layer 3 was of about 3.4 eV. The cladding layers 2, 4 and the active layer 3 were well lattice-matched to the GaP substrate 1 in epitaxial growth.

The bandgap difference between the cladding layers 2, 4 and the active layer 3 was of a value of about 200 meV.

EXAMPLE 4

The substrate 1 was made of a single crystal of GaP. The first and second cladding layers 2, 4 were made of $Zn_xMg_{1-x}S_ySe_{1-y}$ with x being about 0.9 and y about 0.9, and each had a thickness of 1 μm. The active layer 3 was made of $Zn_zCd_{1-z}S$ with z being about 0.9 and had a thickness of 0.1 μm.

An electrode was attached to the reverse side of the substrate 1 and another striped electrode was attached to the second cladding layer 4, and a voltage was applied in a forward direction between the electrodes. Alternatively, an electron beam was applied to the semiconductor laser from the side of the second cladding layer 4 to excite the semiconductor laser. As a result, the semiconductor laser emitted an ultraviolet radiation having a wavelength of about 380 nm.

The materials of the cladding layers 2, 4 in Example 4 were measured for a band-edge emission or excited light BE upon photoluminescence PL. The measured band-edge emission BE was about of 3.6 eV. The band-edge emission BE from the active layer 3 was of about 3.3 eV. The cladding layers 2, 4 and the active layer 3 were well lattice-matched to the GaP substrate 1 in epitaxial growth.

The bandgap difference between the cladding layers 2, 4 and the active layer 3 was of a high value of about 300 meV.

EXAMPLE 5

The substrate 1 was made of a single crystal of n-type GaAs. Then, the n-type cladding layer 2 of MgZnSSe of the above composition with an impurity of Ga or Cl added thereto was deposited to a thickness of about 1 μm on the substrate 1 by way of epitaxial growth. The active layer 3 of ZnSSe was deposited to a thickness of 0.1 μm on the cladding layer 2 by way of epitaxial growth. Thereafter, the p-type cladding layer 4 of BeZnSeTe of the above composition with an impurity of N or P contained therein was deposited on the active layer 3 by way of epitaxial growth. These layers 2, 3, 4 were successively deposited by epitaxial growth.

An electrode was attached to the reverse side of the substrate 1 and another striped electrode was attached to the second cladding layer 4, and a voltage was applied in a forward direction between the electrodes. Alternatively, an electron beam was applied to the semiconductor laser from the side of the second cladding layer 4 to excite the semiconductor laser. As a result, the semiconductor laser emitted a blue radiation.

EXAMPLE 6

The substrate 1 was made of a single crystal of n-type GaP. Then, the n-type cladding layer 2 of MgZnSSe of the above composition doped with with an impurity of Ga or Cl was deposited to a thickness of about 1 μm on the substrate 1 by way of epitaxial growth. The active layer 3 of ZnCdS was deposited to a thickness of 0.1 μm on the cladding layer 2 by way of epitaxial growth. Thereafter, the p-type cladding layer 4 of BeZnSSe doped with N or P was deposited to a thickness of 1 μm on the active layer 3 by way of epitaxial growth. These layers 2, 3, 4 were successively deposited by epitaxial growth.

An electrode was attached to the reverse side of the substrate 1 and another striped electrode was attached to the second cladding layer 4, and a voltage was applied in a forward direction between the electrodes. Alternatively, an electron beam was applied to the semiconductor laser from the side of the second cladding layer 4 to excite the semiconductor laser. As a result, the semiconductor laser emitted a violet radiation.

In Examples 5 and 6 above, the substrates of n-type GaAs and GaP were employed. However, the substrate may be of p-type GaAs or GaP, with the first and second cladding layers being of the opposite conductivity type. Specifically, the first cladding layer 2 may be of the above composition containing Be, and the second cladding layer 4 may be of the composition containing Mg.

In combination with or instead of the striped electrode on the cladding layer 4, current constricting regions for limiting a current may be formed on both sides of a central region of the active layer 3 to provide a striped resonator section in the central region by either introducing an impurity whose conductivity type is different from that of the cladding layer 4 from the side of the cladding layer 4 or bombarding protons for increasing the resistance.

With the present invention, as described above, the substrate 1 of GaAs or GaP is readily available, can easily be manufactured, and is inexpensive, and the cladding layers 2, 4 having a large bandgap are well lattice-matched to the substrate 1. Therefore, the semiconductor laser according to the present invention has good characteristics including high emission efficiency, operates stably, and is capable of continuous excitation and operation at room temperature for emitting radiations at short wavelength.

When the semiconductor laser according to the present invention is used as a light source for optically recording and reproducing information, it allows the information to be recorded and reproduced at high density and high resolution, making it possible to lower the cost of optical recording and reproducing devices incorporating the semiconductor laser of the invention.

Having described a preferred embodiment of the invention with reference to the accompanying drawings, it is to be understood that the invention is not limited to that precise embodiment and that various changes and modifications could be effected by one skilled in the art without departing from the spirit or scope of the invention as defined in the appended claims.

What is claimed is:

1. A semiconductor laser comprising:
a substrate of GaAs;
a first cladding layer of a first conductivity type deposited on said substrate by way of epitaxial growth;
an active layer deposited on said first cladding layer by way of epitaxial growth;
a second cladding layer of a second conductivity type deposited on said active layer by way of epitaxial growth; and
an electrode on the substrate and an electrode on the second cladding layer;
one of said first and second cladding layers having a composition of $Zn_xMg_{1-x}S_ySe_{1-y}$ with atomic ratios x, y being selected in the ranges of:

$$0.3 \leq x \leq 0.9,$$

and $$0.06 \leq y \leq 0.9.$$

2. A semiconductor laser comprising:
a substrate of GaAs;
a first cladding layer of a first conductivity type deposited on said substrate by way of epitaxial growth;
an active layer deposited on said first cladding layer by way of epitaxial growth;
a second cladding layer of a second conductivity type deposited on said active layer by way of epitaxial growth; and
an electrode on the substrate and an electrode on the second cladding layer;
both of said first and second cladding layers having a composition of $Zn_xMg_{1-x}S_ySe_{1-y}$ with atomic ratios x, y being selected in the ranges of:

$$0.3 \leq x \leq 0.9,$$

and $$0.06 \leq y \leq 0.9.$$

3. A semiconductor laser comprising:
a substrate of GaAs;
a first n-type cladding layer deposited on said substrate by way of epitaxial growth;
an active layer deposited on said first n-type cladding layer by way of epitaxial growth;
a second p-type cladding layer deposited on said active layer by way of epitaxial growth;
an electrode on the substrate and an electrode on the second p-type cladding layers;
said first n-type cladding layer having a composition of $Zn_xMg_{1-x}S_ySe_{1-y}$ with atomic ratios x, y being selected in the ranges of:

$$0.3 \leq x \leq 0.9,$$

and $0.06 \leq y \leq 0.9$;

said second p-type cladding layer being made of a semiconductor of BeZnSTe.

4. A semiconductor layer according to claim 3, wherein said second p-type cladding layer has a composition of $Be_aZn_{1-a}S_bTe_{1-b}$ with atomic ratios a, b being selected in the ranges of:

$0.1 \leq a \leq 0.7$, and $0.5 \leq b \leq 0.9$.

5. A semiconductor laser comprising:
a substrate of GaP;
a first cladding layer of a first conductivity type deposited on said substrate by way of epitaxial growth;
an active layer deposited on said first cladding layer by way of epitaxial growth;
a second cladding layer of a second conductivity type deposited on said active layer by way of epitaxial growth; and
an electrode on the second cladding layer and an electrode on the substrate;
one of said first and second cladding layers having a composition of $Zn_xMg_{1-x}S_ySe_{1-y}$ with atomic ratios x, y being selected in the ranges of:

$0.5 \leq x \leq 0.9$, and $0.4 \leq y \leq 0.9$.

6. A semiconductor laser comprising:
a substrate of GaP;
a first cladding layer of a first conductivity type deposited on said substrate by way of epitaxial growth;
an active layer deposited on said first cladding layer by way of epitaxial growth;
a second cladding layer of a second conductivity type deposited on said active layer by way of epitaxial growth; and
an electrode on the second cladding layer and an electrode on the substrate;
both of said first and second cladding layers having a composition of $Zn_xMg_{1-x}S_ySe_{1-y}$ with atomic ratios x, y being selected in the ranges of:

$0.5 \leq x \leq 0.9$, and $0.4 \leq y \leq 0.9$.

7. A semiconductor laser comprising:
a substrate of GaP;
a first n-type cladding layer deposited on said substrate by way of epitaxial growth;
an active layer deposited on said first n-type cladding layer by way of epitaxial growth;
a second p-type cladding layer deposited on said active layer by way of epitaxial growth; and
an electrode on the substrate and an electrode on the second p-type cladding layer;
said first n-type cladding layer having a composition of $Zn_xMg_{1-x}S_ySe_{1-y}$ with atomic ratios x, y being selected in the ranges of:

$0.5 \leq x \leq 0.9$, and $0.4 \leq y \leq 0.9$;

said second p-type cladding layer being made of a semiconductor of BeZnSTe.

8. A semiconductor layer according to claim 7, wherein said second p-type cladding layer has a composition of $Be_aZn_{1-a}S_bTe_{1-b}$ with atomic ratios a, b being selected in the ranges of:

$0.1 \leq a \leq 0.8$, and $0.2 \leq b \leq 0.9$.

* * * * *